US012685002B2

(12) United States Patent
Lee et al.

(10) Patent No.: US 12,685,002 B2
(45) Date of Patent: Jul. 14, 2026

(54) DISPLAY DEVICE

(71) Applicant: LG Display Co., Ltd., Seoul (KR)

(72) Inventors: KyooHo Lee, Goyang si (KR);
JaeYoung Oh, Goyang si (KR);
KyoungJin Nam, Paju si (KR)

(73) Assignee: LG Display Co., Ltd., Seoul (KR)

( * ) Notice: Subject to any disclaimer, the term of this
patent is extended or adjusted under 35
U.S.C. 154(b) by 390 days.

(21) Appl. No.: 18/391,256

(22) Filed: Dec. 20, 2023

(65) Prior Publication Data

US 2024/0224765 A1 Jul. 4, 2024

(30) Foreign Application Priority Data

Dec. 30, 2022 (KR) .......................... 10-2022-0191306

(51) Int. Cl.
H10K 59/80 (2023.01)
H10K 59/122 (2023.01)
H10K 59/38 (2023.01)
H10K 102/00 (2023.01)
H10K 102/10 (2023.01)

(52) U.S. Cl.
CPC ....... H10K 59/8792 (2023.02); H10K 59/122
(2023.02); H10K 59/38 (2023.02); *H10K*
*59/878* (2023.02); *H10K 2102/102* (2023.02);
*H10K 2102/103* (2023.02); *H10K 2102/331*
(2023.02)

(58) Field of Classification Search
CPC .. H10K 59/122; H10K 59/8792; H10K 59/38;
H10K 59/878
See application file for complete search history.

(56) References Cited

U.S. PATENT DOCUMENTS

| | | | | |
|---|---|---|---|---|
| 2019/0165326 A1* | 5/2019 | Kim | ...................... | H10K 59/122 |
| 2021/0399068 A1* | 12/2021 | Kim | ...................... | H10K 59/38 |
| 2023/0105374 A1* | 4/2023 | Jeong | ................... | H10K 59/878 |
| | | | | 257/40 |

FOREIGN PATENT DOCUMENTS

| | | |
|---|---|---|
| KR | 20180014380 A | 2/2018 |
| KR | 20200118316 A | 10/2020 |
| KR | 20210124583 A | 10/2021 |

* cited by examiner

*Primary Examiner* — Steven M Page
(74) *Attorney, Agent, or Firm* — Seed Intellectual
Property Law Group LLP

(57) ABSTRACT

Embodiments of the disclosure relate to a display device.
Specifically, there may be provided a display device capable
of mitigating leakage of light reflected at an auxiliary layer
by reducing the cell gap between the light emitting element
and the auxiliary layer by including a substrate including a
light emitting element, a bank layer disposed on the sub-
strate and defining an opening overlapping the light emitting
element, a trench having a lower surface disposed to have a
predetermined depth from an upper surface of the bank layer
and a sidewall portion connecting the lower surface and the
upper surface, a black matrix protruding beyond the upper
surface of the bank layer and seated in the trench, a light
conversion layer including quantum dots and disposed on
the light emitting element, and an auxiliary layer disposed
on the light conversion layer and including a reflective
material.

14 Claims, 5 Drawing Sheets

DISPLAY DEVICE

CROSS-REFERENCE TO RELATED APPLICATION

This application claims priority from Korean Patent Application No. 10-2022-0191306, filed on Dec. 30, 2022, which is hereby incorporated by reference for all purposes as if fully set forth herein.

BACKGROUND

Technical Field

Embodiments of the disclosure relate to a display device.

Description of the Related Art

Display devices are widely used as display screens for laptop computers, tablet computers, smartphones, portable display devices, and portable information devices, as well as for televisions or monitors.

Display devices may be divided into reflective display devices and emissive display devices. The reflective display device is a display device that displays information by reflecting natural light or light from an external light source of the display device to the display device. The emissive display device displays information using the light generated from light emitting elements or a light source embedded in the display device.

BRIEF SUMMARY

The conventional display device has the adjacent pixel emission issue that arises as the light emitted from a light emitting element is guided and leaks to the adjacent pixel due to multiple transparent layers disposed between the light emitting element and the light conversion layer including quantum dots.

Embodiments of the disclosure may provide a display device capable of mitigating leakage of the light reflected at the auxiliary layer by reducing the cell gap between the light emitting element and the auxiliary layer by having a structure in which a black matrix is inserted into a trench provided in the bank layer.

Embodiments of the disclosure provide a display capable of enhancing light extraction efficiency by increasing light conversion efficiency in quantum dots included in the light conversion layer by having a structure in which the auxiliary layer includes a reflective material, and the second electrode includes a transparent conductive material.

Embodiments of the disclosure provide a display device requiring a reduction in pixel size and an increase in the number of pixels through enhancement of the viewing angle by reducing the external propagation distance of the light reflected at the auxiliary layer by having a structure in which a black matrix is inserted into a trench provided in the bank layer.

Embodiments of the disclosure may provide a display device capable of preventing migration of quantum dots to the adjacent pixels when manufacturing the light conversion layer by having a structure in which a black matrix is inserted into a trench provided in the bank layer.

Embodiments of the disclosure may provide a display device comprising a substrate including at least one of red, green, and blue subpixels, a color filter layer disposed on the substrate and having a color corresponding to each of the at least one subpixel, a light emitting element including a first electrode disposed on the color filter layer, a light emitting layer disposed on the first electrode, and a second electrode disposed on the light emitting layer, a bank layer having an opening exposing at least a portion of the first electrode, a black matrix disposed in a trench provided in the bank layer and protruding beyond an upper surface of the bank layer, a light conversion layer disposed on the light emitting element and including quantum dots, and an auxiliary layer disposed on the light conversion layer.

Embodiments of the disclosure may provide the display device, wherein the first electrode and the second electrode include a transparent conductive material, and wherein the auxiliary layer includes a reflective material.

Embodiments of the disclosure may provide a display device comprising a substrate, a color filter layer disposed on the substrate, a light emitting element disposed on the color filter layer, a bank layer disposed on the substrate and defining an opening overlapping the light emitting element and having an upper surface and a lower surface smaller in width than the upper surface, a first quantum dot barrier layer disposed on the light emitting element and the bank layer, a second quantum dot barrier layer disposed to be spaced apart from the first quantum dot barrier layer, an auxiliary layer disposed on the second quantum dot barrier layer, and a light conversion layer disposed between the first quantum dot barrier layer and the second quantum dot barrier layer, wherein the light conversion layer is filled with quantum dots from the lower surface of the opening to the upper surface of the opening.

According to embodiments of the present disclosure, there may be provided a display device capable of mitigating leakage of the light reflected at the auxiliary layer by reducing the cell gap between the light emitting element and the auxiliary layer.

According to embodiments of the disclosure, there may be provided a display device capable of enhancing light extraction efficiency by increasing the light conversion efficiency in quantum dots included in the light conversion layer.

According to embodiments of the disclosure, there may be provided a display device requiring a reduction in pixel size and an increase in the number of pixels through enhancement of the viewing angle by reducing the external propagation distance of the light reflected at the auxiliary layer.

According to embodiments of the present disclosure, there may be provided a display device capable of preventing migration of quantum dots to the adjacent pixels when manufacturing the light conversion layer.

DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
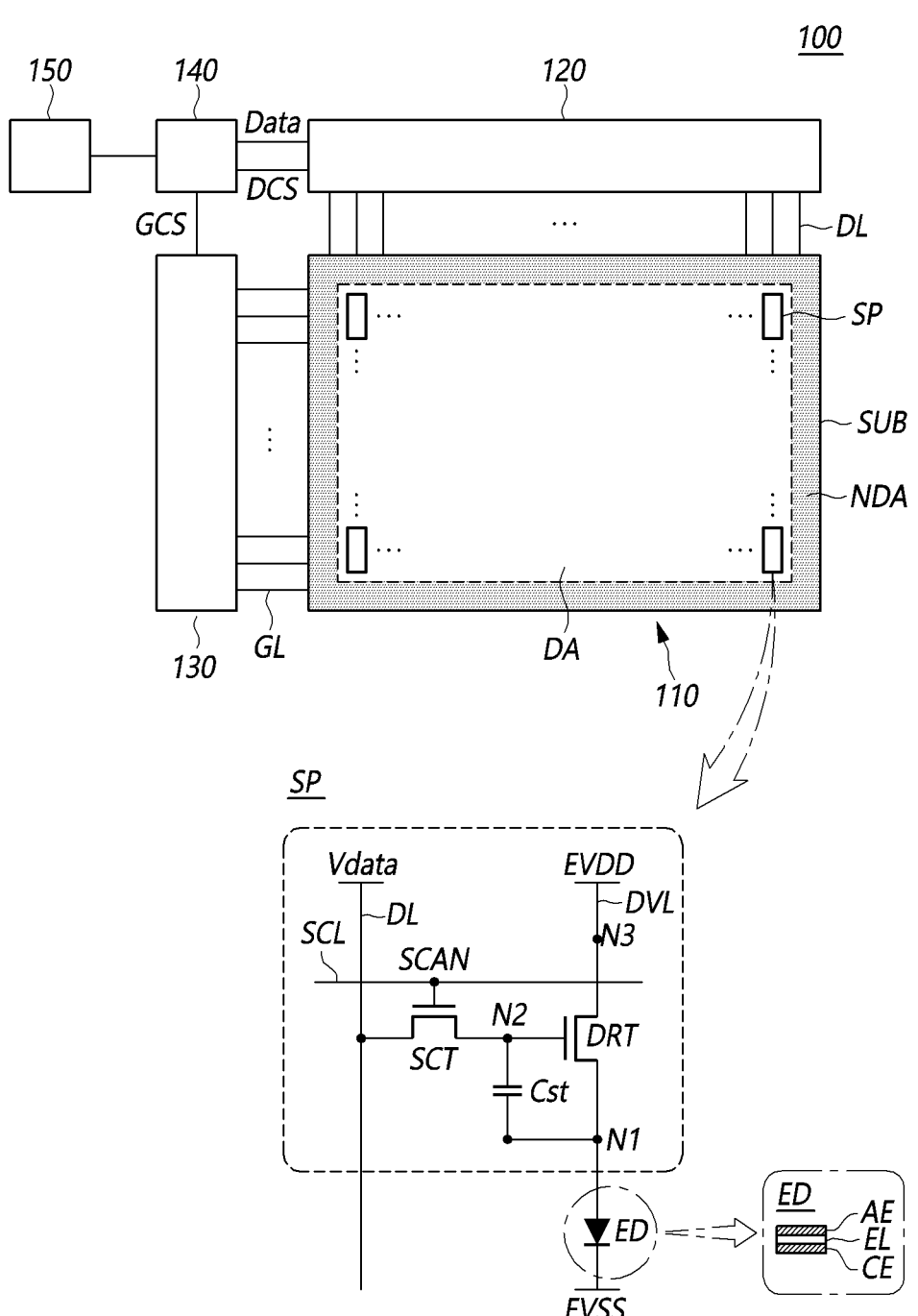
FIG. 1 is a view schematically illustrating a system configuration of a display device according to embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the disclosure are described in detail with reference to the accompanying drawings.

Figure 2:
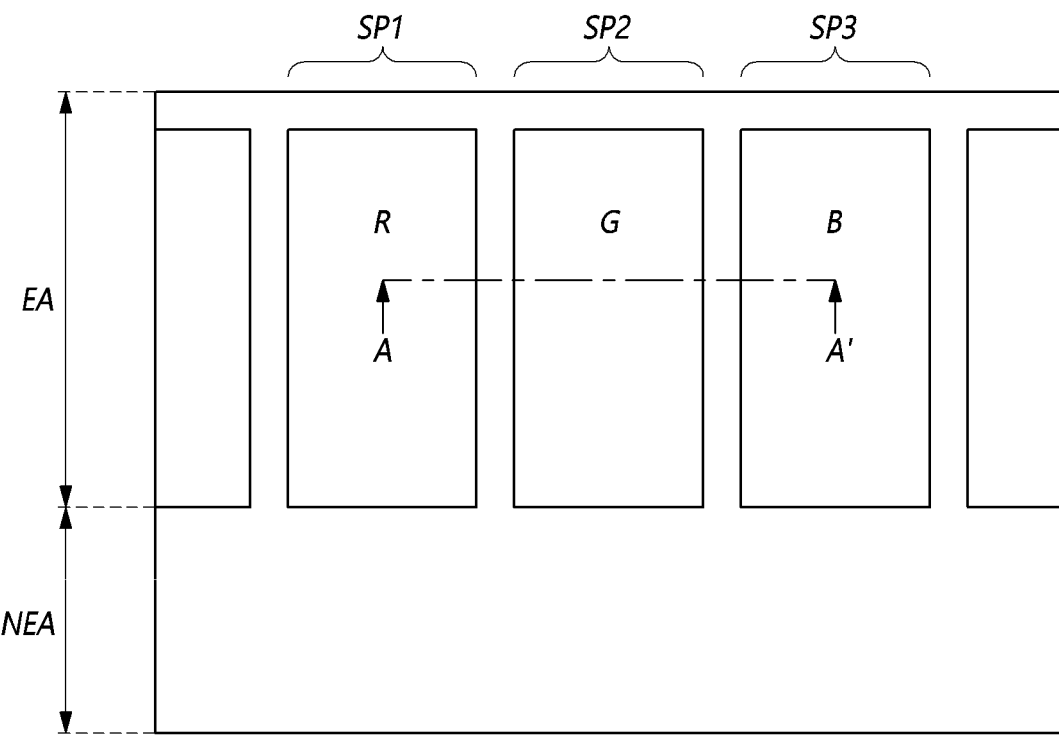
FIG. 2 is a view illustrating a schematic planar structure of a pixel structure disposed on a display panel of a display device according to embodiments of the disclosure.

FIG. 1 is a view schematically illustrating a system configuration of a display device according to embodiments of the disclosure. FIG. 2 is a view illustrating a schematic planar structure of a pixel structure disposed on a display panel of a display device according to embodiments of the disclosure.

Referring to FIG. 1, a display driving system of a display device 100 according to embodiments of the disclosure may include a display panel 110 and display driving circuits for driving the display panel 110.

The display panel 110 may include a display area DA in which images are displayed and a non-display area NDA in which no image is displayed. The display panel 110 may include a plurality of subpixels SP disposed on a substrate SUB for image display. The display panel 110 may include a plurality of signal lines disposed on the substrate SUB. For example, the plurality of signal lines may include data lines DL, gate lines GL, driving voltage lines, and the like.

Each of the plurality of data lines DL is disposed while extending in a first direction (e.g., a column direction or a row direction), and each of the plurality of gate lines GL is disposed while extending in a direction crossing the first direction.

The display driving circuits may include a data driving circuit 120, a gate driving circuit 130, and a controller 140 controlling the data driving circuit 120 and the gate driving circuit 130.

The data driving circuit 120 may output data signals (also referred to as data voltages) corresponding to an image signal to the plurality of data lines DL. The gate driving circuit 130 may generate gate signals and output the gate signals to the plurality of gate lines GL. The controller 140 may convert the input image data input from an external host 150 to meet the data signal format used in the data driving circuit 120 and supply the converted image data to the data driving circuit 120.

The data driving circuit 120 may include one or more source driver integrated circuits. For example, each source driver integrated circuit may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may be connected to the display panel 110 by a tape automatic bonding (TAB) method, connected to a bonding pad of the display panel 110 by a COG or COP method, connected to the display panel 110 by a COF method, or may be formed in the non-display area NDA of the display panel 110 by a gate in panel (GIP) method.

Referring to FIG. 1, in the display device 100 according to embodiments of the disclosure, each subpixel SP may include a light emitting element ED and a pixel driving circuit SPC for driving the light emitting element ED. The pixel driving circuit SPC may include a driving transistor DRT, a scan transistor SCT, and a storage capacitor Cst.

The driving transistor DRT may control a current flowing to the light emitting element ED to drive the light emitting element ED. The scan transistor SCT may transfer the data voltage Vdata to the second node N2 which is the gate node of the driving transistor DRT. The storage capacitor Cst may be configured to maintain a voltage for a predetermined period of time.

The light emitting element ED may include an anode electrode AE and a cathode electrode CE, and a light emitting layer EL positioned between the anode electrode AE and the cathode electrode CE. The anode electrode AE may be a pixel electrode involved in forming the light emitting element ED of each subpixel SP and may be electrically connected to the first node N1 of the driving transistor DRT. The cathode electrode CE may be a common electrode involved in forming the light emitting elements ED of all the subpixels SP, and a ground voltage EVSS may be applied thereto.

For example, the light emitting element ED may be an organic light emitting diode OLED, an inorganic light emitting diode (LED), or a quantum dot light emitting element, which is a self-luminous semiconductor crystal.

If the display device 100 according to embodiments of the disclosure is an OLED display, each subpixel SP may include an organic light emitting diode (OLED), which by itself emits light, as the light emitting element. If the display device 100 according to embodiments of the disclosure is a quantum dot display, each subpixel SP may include a light emitting element formed of a quantum dot, which is a self-luminous semiconductor crystal. If the display device 100 according to embodiments of the disclosure is a micro LED display, each subpixel SP may include a micro LED, which is self-emissive and formed of an inorganic material, as the light emitting element.

The driving transistor DRT is a transistor for driving the light emitting element ED, and may include a first node N1, a second node N2, and a third node N3. The first node N1 may be a source node or a drain node, and may be electrically connected to the anode electrode AE of the light emitting element ED. The second node N2 is a gate node and may be electrically connected to the source node or drain node of the scan transistor SCT. The third node N3 may be a drain node or a source node, and may be electrically connected to a driving voltage line DVL that supplies the driving voltage EVDD. For convenience of description, in the example described below, the first node N1 may be a source node and the third node N3 may be a drain node.

The scan transistor SCT may switch the connection between the data line DL and the second node N2 of the driving transistor DRT. In response to the scan signal SCAN supplied from the scan line SCL which is a kind of the gate line GL, the scan transistor SCT may control connection between the second node N2 of the driving transistor DRT and a corresponding data line DL among the plurality of data lines DL.

The storage capacitor Cst may be configured between the first node N1 and second node N2 of the driving transistor DRT.

The structure of the subpixel SP illustrated in FIG. 1 is merely an example for description, and may further include one or more transistors, or one or more storage capacitors. The plurality of subpixels SP may have the same structure, or some of the plurality of subpixels SP may have a different structure. Each of the driving transistor DRT and the scan transistor SCT may be an n-type transistor or a p-type transistor.

The display device 100 according to embodiments of the disclosure may have a top emission structure or a bottom emission structure. The bottom emission structure is described below as an example.

Referring to FIG. 2, a display device 100 according to embodiments includes a plurality of subpixels SP1 to SP4, and each subpixel SP1 to SP4 includes an emission area EA that emits light for displaying and a non-emission area NEA other than the emission area.

The display device 100 according to embodiments includes a bank layer to partition each of the subpixels SP1 to SP4.

In the subpixel structure of the display device 100 according to embodiments of the disclosure also includes a "signal line connection structure" that is related to connection of each subpixel to several signal lines, such as the data line DL, gate line GL, driving voltage line DVL, and reference voltage line RVL.

The signal lines may include not only the data line DL for supplying the data voltage Vdata to each subpixel and the gate line GL for supplying the scan signal but also a reference voltage Vref for supplying the reference voltage Vref to each subpixel and a driving voltage line DVL for supplying the driving voltage EVDD.

In the disclosure and drawings, the subpixel connected to the 4n−3th data line DL(4n−3), the subpixel connected to the 4n−2th data line DL(4n−2), the subpixel connected to the 4n−1th data line DL(4n−1), and the subpixel connected to the 4nth data line DL(4n) may be, e.g., a red (R) subpixel, a green (G) subpixel, a blue (W) subpixel, and a white (W) subpixel, respectively.

However, without limitations thereto, the red (R) subpixel, the green (G) subpixel, the blue (B) subpixel, and the white (W) subpixel may be arranged in other various orders. A pixel structure having the order of the red (R) subpixel SP1, the green (G) subpixel SP2, the blue (B) subpixel SP3, and the white (W) subpixel SP4 is described below.

As described above, when the default unit of the signal line connection structure includes four subpixels SP1 to SP4 connected to four data lines DL(4n−3), DL(4n−2), DL(4n−1), and DL(4n), one reference voltage line RVL for supplying the reference voltage Vref and two driving voltage lines DVL for supplying the driving voltage EVDD may be formed for the four subpixels SP1 to SP4. The four data lines DL(4n−3), DL(4n−2), DL(4n−1), and DL(4n) are connected to the four subpixels SP1 to SP4, respectively. Further, one gate line GL(m) (where 1≤m≤M) is connected to the four subpixels SP1 to SP4.

In the display device 100 according to embodiments of the disclosure, the light emitting element ED emitting white (W) or blue (B) light is commonly disposed in each subpixel, and a red (R) color filter, a blue (B) color filter, and a green (G) color filter are disposed in the red (R) subpixel SP1, the blue (B) subpixel SP3, and the green (G) subpixel SP4, respectively. No separate color filter is disposed in the white (W) subpixel SP2.

Figure 3:
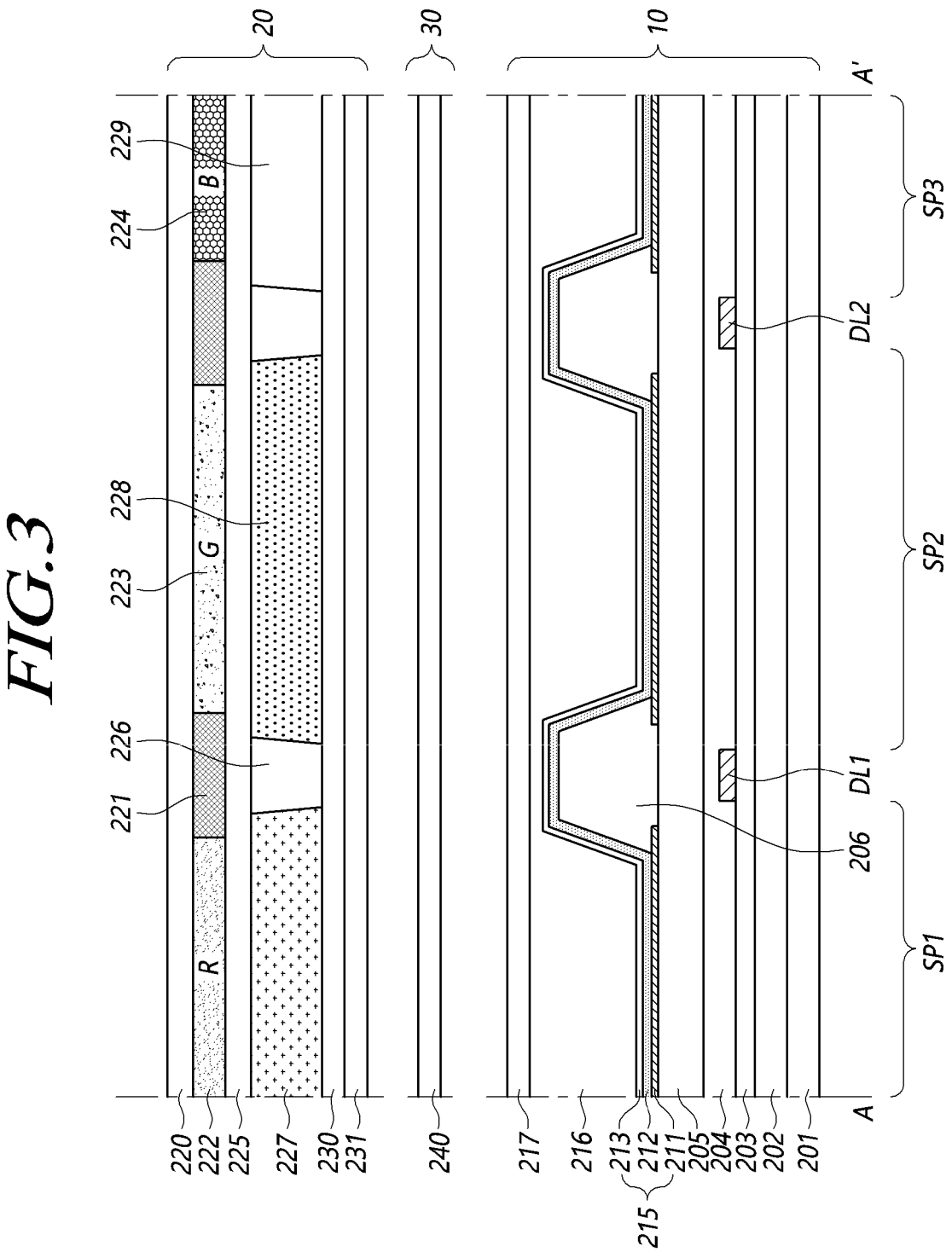
FIG. 3 is a cross-sectional view taken along line A-A' of FIG. 2 to which a structure according to embodiments of the disclosure does not applies.
Figure 4:
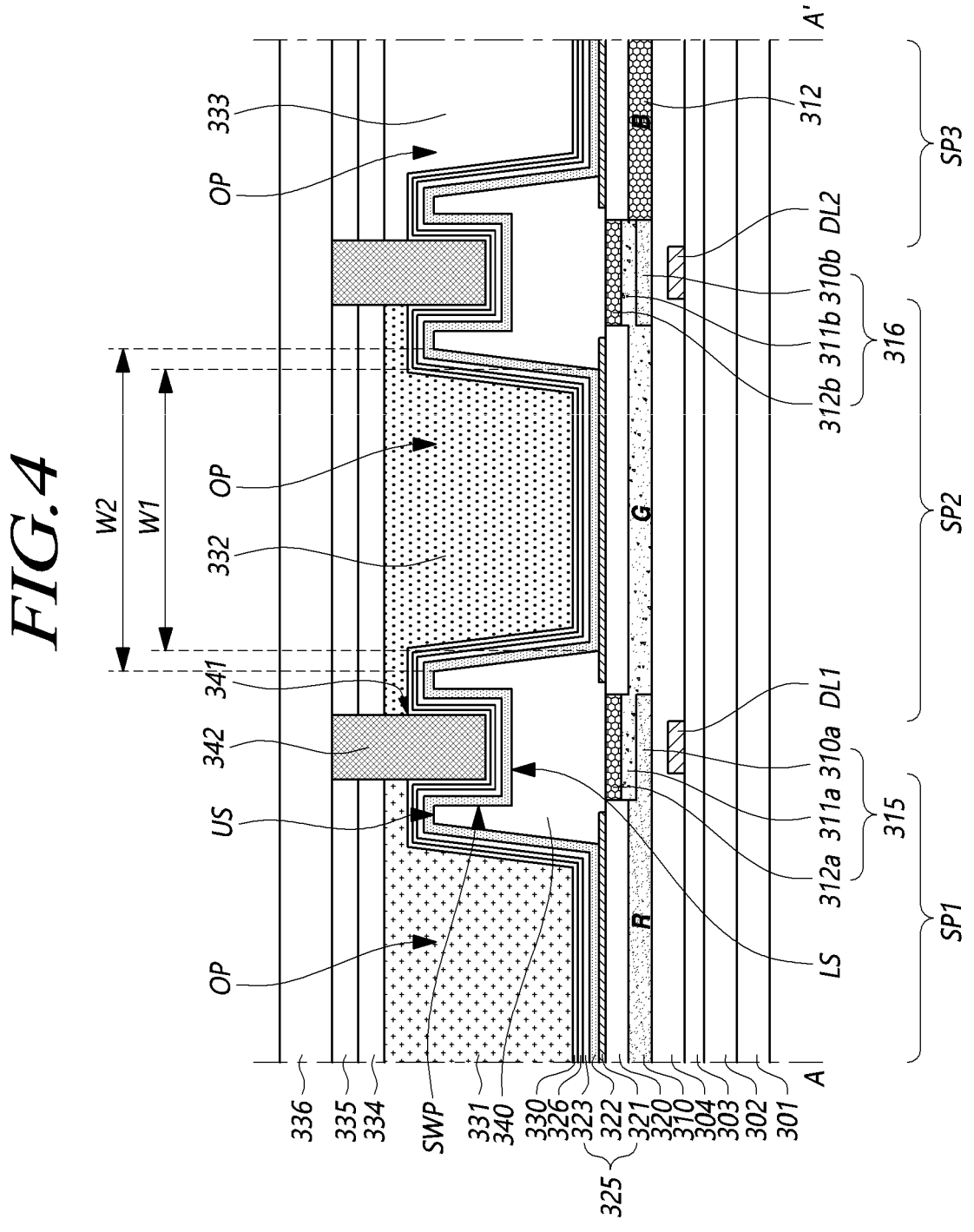
FIG. 4 is a cross-sectional view taken along line A-A' of FIG. 2 to which a structure according to embodiments of the disclosure applies.

FIG. 3 is a cross-sectional view illustrating a conventional display device, and FIG. 4 is a cross-sectional view illustrating a display device according to embodiments of the disclosure. Specifically, FIG. 3 is a cross-sectional view taken along line A-A' of FIG. 2 to which a structure according to embodiments of the disclosure does not applies. FIG. 4 is a cross-sectional view taken along line A-A' of FIG. 2 to which a structure according to embodiments of the disclosure applies.

Referring to FIG. 3A, in the conventional display device, an upper unit 20 including the light conversion layer 227 and 228 and the color filter layer 222, 223, and 224, and a lower unit 10 including the light emitting element 215 and the thin film transistor (not shown) are manufactured by separate processes, and then the upper unit 20 and the lower unit 10 are bonded together.

Referring to FIG. 3, a QD bank 226 is an essential component to generate the light conversion layer 227, 228, and 229 for each subpixel, and an additional process for generating the QD bank 226 as well as the black matrix 221 of the color filter layer 222, 223, and 224 is required.

Further, a plurality of layers are present between the light emitting element 215 and the light conversion layer 227, 228, and 229. For example, various layers, such as a filling layer 216, a lower encapsulation layer 217, an adhesive layer 240, an upper encapsulation layer 231, and a quantum dot protection layer 230 are included, and these layers are transparent layers through which the light from the light emitting element 215 may be transmitted.

Due to the plurality of transparent layers disposed between the light emitting element 215 and the light conversion layer 227, 228, and 229, light may leak to adjacent pixels as the result of the light guide effect of blue light output from the light emitting element 215, causing the adjacent pixels to emit light.

Referring to FIG. 4, a display device 100 according to embodiments of the disclosure may include a substrate 301 including a light emitting element 325, a bank layer 340 disposed on the substrate and defining an opening OP overlapping the light emitting element, a trench 341 including a lower surface LS disposed to have a predetermined depth from an upper surface US of the bank layer 340 and a sidewall portion SWP connecting the lower surface LS and the upper surface US, a black matrix 342 protruding beyond the upper surface US of the bank layer 340 and seated in the trench, a light conversion layer including quantum dots and disposed on the light emitting element, and an auxiliary layer 335 disposed on the light conversion layer and including a reflective material.

A plurality of subpixels may be disposed on the substrate 301. The substrate 301 may include at least one of red, green, and blue subpixels.

The substrate 301 may be selected as a material for forming an element having excellent mechanical strength or dimensional stability. The substrate 301 may be not only a glass substrate, but also a plastic substrate including polyethylene terephthalate (PET), polyethylene naphthalate (PEN), polyimide, or the like.

The buffer layer 302 serves to protect a thin film transistor (not shown) formed in a subsequent process from impurities such as alkali ions flowing out of the substrate 301. The buffer layer 302 may be a single layer of silicon oxide $(SiO_x)$ or silicon nitride $(SiN_x)$ or multiple layers thereof.

A passivation layer 303 may be disposed on the buffer layer 302.

The passivation layer 303 is an insulation film for protecting elements thereunder, and may be a single layer of silicon oxide $(SiO_x)$ or silicon nitride $(SiN_x)$ or multiple layers thereof. Also, the passivation layer 303 may be omitted.

A plurality of signal lines DL1 and DL2 may be disposed on the passivation layer 303, and an insulation layer 304 may be disposed on the plurality of signal lines DL1 and DL2.

The insulation layer 304 is an insulation film for protecting the signal lines thereunder, and may be a single layer of silicon oxide $(SiO_x)$ or silicon nitride $(SiN_x)$ or multiple layers thereof. Also, the insulation layer 304 may be omitted.

The color filter layer 310, 311, and 312 and the light blocking layer 315 and 316 may be disposed on the auxiliary layer 304.

The color filter layers 310, 311, and 312 may be disposed to correspond to the emission areas of the subpixels SP1 to SP3, respectively.

The red (R) color filter layer 310 may be disposed in the red (R) subpixel SP1 area, and the green (G) color filter layer 311 and the blue (B) color filter layer 312 may be disposed in the green (G) subpixel SP2 area and the blue (B) subpixel SP3 area, respectively.

The light blocking layer 315 and 316 may be disposed to correspond to the non-emission area between subpixels. The light blocking layer 315 may include red (R), green (G), and blue (B) color patterns 310a, 311a, and 312a.

The light blocking layer 315 and 316 may be formed as the red (R) color pattern 310a and 310b formed when the red (R) color filter layer 310, the green (G) color pattern 311a and 311b formed when the green (G) color filter layer 311 is formed, and the blue (B) color pattern 312a and 312b formed when the blue (B) color filter layer 312 is formed are stacked.

Referring to FIG. 4, the light blocking layer 315 is formed as three layers of red (R), green (G), and blue (B) color patterns 310a, 311a, and 312a are stacked, but it may also be formed as at least two different color patterns are stacked.

In the light blocking layer 315 and 316, the red (R) color pattern 310a and 310b, the green (G) color pattern 311a and 311b, and the blue (B) color pattern 312a and 312b are stacked, blocking the light incident from the outside and the light emitted from the inside. Accordingly, in the display device according to embodiments of the disclosure, the light blocking layer 315 and 316 is formed as color patterns are stacked, so that the process may be simplified.

Meanwhile, the black matrix may be formed in a separate process without forming the light blocking layer by stacking color patterns.

The overcoat layer 320 may be disposed on the color filter layer 310, 311, and 312.

The overcoat layer 320 may be formed of an organic film such as an acryl resin, an epoxy resin, a phenolic resin, a polyamide resin, a polyimide resin, or the like. The overcoat layer 320 may planarize the surface of the substrate 301 on which the thin film transistor (not shown) and various signal lines are formed.

The light emitting element 325 may be disposed on the overcoat layer 320. For example, the light emitting element 325 may be an organic light emitting diode OLED, an inorganic light emitting diode (LED), or a quantum dot light emitting element, which is a self-luminous semiconductor crystal.

Described below is an example in which the light emitting element 325 is an organic light emitting diode (OLED), but the disclosure is not limited thereto.

The light emitting element 325 may include a first electrode 321, a light emitting layer 322, and a second electrode 323.

An encapsulation layer 326 in which a plurality of organic films and inorganic films are stacked may be further formed on the light emitting element 325.

The first electrode 321 is a pixel electrode serving as an anode, and may be independently disposed in each of the subpixels.

The first electrode may include a transparent conductive material.

For example, the transparent conductive material included in the first electrode 321 may include any one of indium-tin-oxide (ITO), indium-zinc-oxide (IZO), indium-gallium-zinc-oxide (IGZO), indium-tin-zinc-oxide (ITZO), zinc-tin-oxide (ZTO), fluorine-tin-oxide (FTO), aluminum-zinc-oxide (AZO), antimony-tin-oxide (ATO), titanium oxide (TiO$_2$), indium oxide (In$_2$O$_3$), tin oxide (SnO$_2$), zinc oxide (ZnO), and silver-magnesium (Ag—Mg) alloys.

The light emitting layer 322 may be an organic light emitting layer 322. The organic light emitting layer 322 may include multiple layers of a hole injection layer, a hole transport layer, a light emitting material layer, an electron transport layer, and an electron injection layer to increase light emission efficiency.

The second electrode 323 is a common electrode serving as a cathode, and may be commonly disposed in all subpixels SP1 to SP3.

The second electrode 323 may include a transparent conductive material.

For example, the transparent conductive material included in the second electrode 323 may include any one of indium-tin-oxide (ITO), indium-zinc-oxide (IZO), indium-gallium-zinc-oxide (IGZO), indium-tin-zinc-oxide (ITZO), zinc-tin-oxide (ZTO), fluorine-tin-oxide (FTO), aluminum-zinc-oxide (AZO), antimony-tin-oxide (ATO), titanium oxide (TiO$_2$), indium oxide (In$_2$O$_3$), tin oxide (SnO$_2$), zinc oxide (ZnO), and silver-magnesium (Ag—Mg) alloys.

The second electrode 323 may include a semi-transmissive conductive material.

For example, the semi-transmissive conductive material included in the second electrode 323 may include silver (Ag), magnesium (Mg), or an alloy of silver (Ag) and magnesium (Mg).

The second electrode 323 may have a single-layer structure of the above-described transparent conductive material or semi-transmissive conductive material or may have a multi-layer structure of a transparent conductive material and a semi-transmissive conductive material.

An encapsulation layer 326 in which a plurality of organic films and inorganic films are stacked may be disposed on the light emitting element 325.

The encapsulation layer 326 may be formed by alternately stacking a plurality of inorganic films and organic films. For example, the inorganic film may be formed of at least one of aluminum oxide (Al$_x$O$_x$), silicon oxide (SiO$_x$), SiN$_x$, SiON, and LiF to primarily block penetration of external moisture or oxygen, but is not limited thereto. The organic film may secondarily block the penetration of external moisture or oxygen. The organic film serves as a buffer for relieving stress between layers due to bending of the display device 100 and may also serve to enhance planarization performance. Such an organic film may be formed of a polymer material such as an acrylic resin, an epoxy resin, polyimide, or polyethylene, but is not limited thereto.

A first quantum dot barrier layer 330 may be disposed on the encapsulation layer 326.

The light emitting layer 322 of the light emitting element 325 is very vulnerable to impurities, such as moisture or oxygen from the outside. Therefore, it is beneficial to prevent the outgassing generated from the light transmissive layer 333 or the light conversion layer 331 and 332 including quantum dots from traveling toward the light emitting layer 322 of the light emitting element 325 in the manufacturing process or during use after manufacturing is done.

To that end, a first quantum dot barrier layer 330 may be interposed between the second electrode 323 and the light conversion layer 331 and 332 or the light transmissive layer 333.

The first quantum dot barrier layer 330 may be formed of an inorganic material such as silicon nitride (SiN$_x$), silicon oxide (SiO$_x$), silicon oxynitride (SiO$_x$N$_y$), or the like to prevent the outgassing from passing therethrough. The first quantum dot barrier layer 330 may be formed of a single layer or multiple layers thereof.

The bank layer 340 may be disposed on the overcoat layer 320, the first electrode 321, and the light blocking layer 315 and 316.

Figure 5:
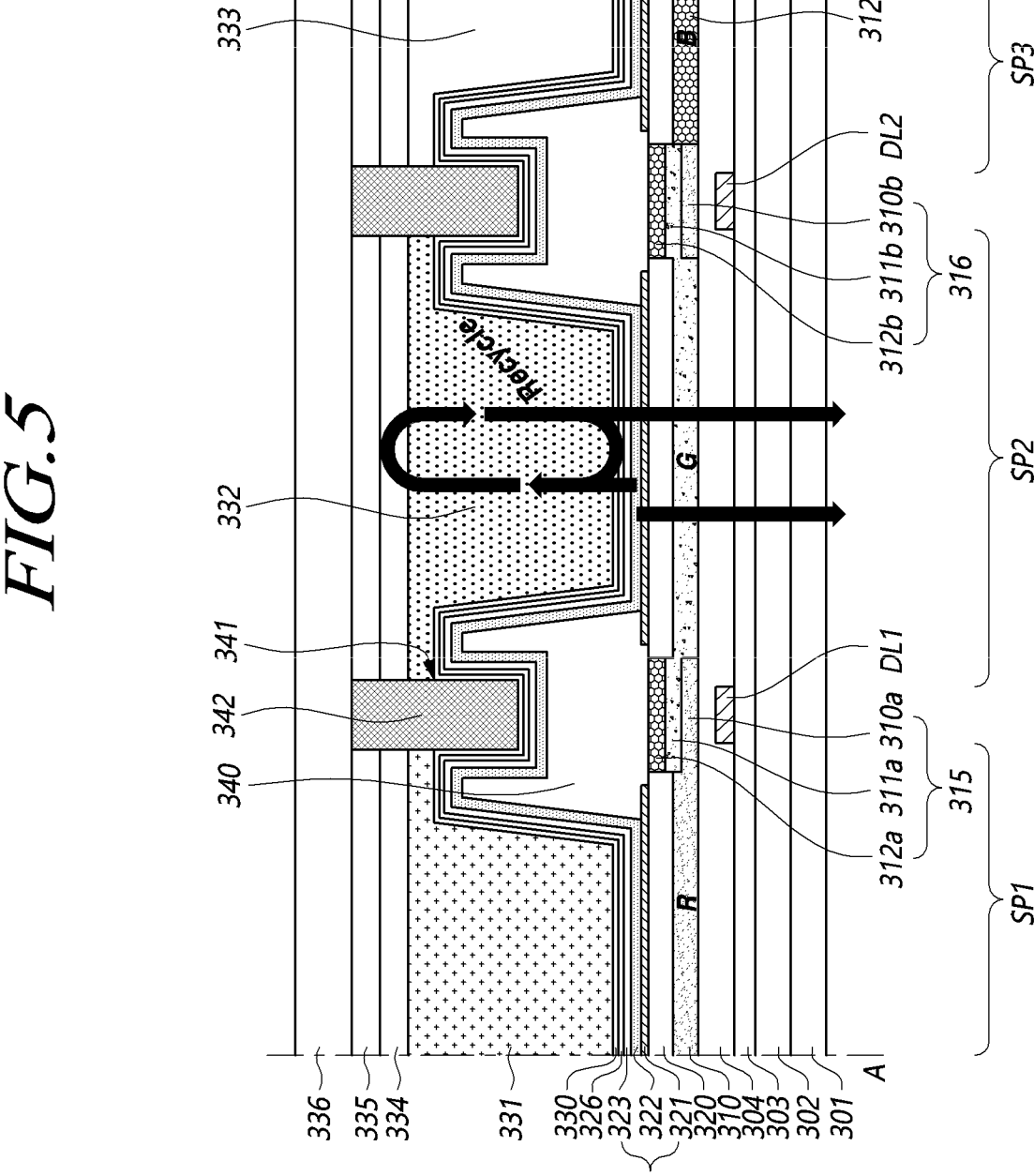
FIG. 5 is a cross-sectional view illustrating a structural feature of a display device to which a structure according to embodiments of the disclosure is applied.

The bank layer 340 may define an opening OP overlapping the light emitting element 325. Further, the bank layer 340 may define an opening OP by exposing at least a portion of the first electrode 321. The first electrode 321 has a portion that extends into the bank layer 340 as shown in FIGS. 4 and 5. Further, as shown in FIG. 4, an opening OP is formed between the adjacent bank layers 340 and the opening OP exposes a top surface of the first electrode 321. The opening OP is filled by sequentially stacking layer 322, 323, 326, 330 and so forth.

The bank layer 340 may define an emission area of the display device 100, and thus may be referred to as a pixel defining film. The bank layer 340 may be an organic insulating material. For example, the bank layer 340 may be formed of a polyimide, acryl, or benzocyclobutene (BCB) resin, but is not limited thereto.

The trench 341 and the black matrix 342 may be disposed on the bank layer 340. In particular, the black matrix 342 is disposed over the lower surface LS of the bank layer 340 and protrudes towards the auxiliary layer 335. In some embodiments, the black matrix 342 protrudes beyond the upper surface US of the bank layer 340. In one embodiment, the black matrix 342 may have an upper surface that is coplanar with an upper surface of the auxiliary layer 335.

Referring to FIG. 4, the black matrix 342 may be disposed in the trench 341 provided in the bank layer 340.

The black matrix 342 may protrude beyond the upper surface of the bank layer 340 and may be seated in the trench 341. In other words, the black matrix 342 may be formed in the trench 341 of the bank layer 340 in a correct position, so that the bank layer 340 and the black matrix 342 may define the emission area of the display device 100.

The width of the upper surface of the black matrix 342 may not be greater than the width of the upper portion of the trench 341.

For example, the width of the upper surface of the black matrix 342 may be smaller than the width of the upper portion of the trench 341. In other words, the black matrix 342 may have a forward taper shape on the bank layer 340.

By applying the structure in which the black matrix 342 is deposited and inserted into the trench 341 provided in the bank layer 340, the cell gap between the light emitting element 325 and the auxiliary layer 335 may be reduced (or minimized) to minimize leakage of the light reflected at the auxiliary layer 335.

Further, as the distance in which the light reflected at the auxiliary layer 335 travels outward decreases, it may be applied to display devices that require a reduction in pixel size and an increase in the number of pixels through enhancement of the field of view.

The light conversion layer 331 and 332 may be disposed on the first quantum dot barrier layer 330. The light transmissive layer 333 may be disposed on the first quantum dot barrier layer 330.

The light conversion layer 331 and 332 may convert light output from the light emitting element 325 into light of a color corresponding to each subpixel. The light conversion layer 331 and 332 may include quantum dots.

The light conversion layer 331 and 332 may include quantum dots of different sizes or types to convert light of the color corresponding to each subpixel.

The type of quantum dots included in the light conversion layer is not particularly limited. The light conversion layer may include quantum dots of a single layer structure including one or more of group III-V semiconductor nanocrystals and group II-VI semiconductor nanocrystals or quantum dots of a multilayer structure having a core/shell structure.

Quantum dots are nanoparticles and feature photoluminescence (PL) in which electrons excited to a high energy level by external light emit light while returning to a low energy level. This feature of quantum dots may be utilized to convert the wavelength of light emitted from the light source of the display device. In particular, since quantum dots emit light having different wavelengths depending on the diameter, the quantum dots may be applied to manufacture a display device having high color purity by precisely controlling the diameter in the manufacturing process of the quantum dots. However, there is an issue that quantum dots have low conversion efficiency of PL emission, and embodiments of the disclosure may address such an issue.

For example, the quantum dots may be included in the light conversion layer 331 and 332 by an inkjet method.

When using the inkjet method, if the structure in which the black matrix 342 is deposited and inserted into the trench 341 provided in the bank layer 340 is applied, the bank layer 340 of the light conversion layer is heightened by the height of the black matrix 342, thus preventing quantum dots from overflowing into adjacent subpixels.

The light conversion layer 331 and 332 may include a first light conversion layer 331, a second light conversion layer 332, and a third light conversion layer (not shown) according to respective subpixels.

When the light output from the light emitting element is blue light, the first light conversion layer 331 may convert the light output from the light emitting element into first light, and the first light may be red light. The second light conversion layer 332 may convert light output from the light emitting element into second light, and the second light may be green light.

When the light output from the light emitting element is blue light, the light conversion layer may be the light transmissive layer 333 that does not include quantum dots. In other words, the light transmissive layer 333 may transmit blue light output from the light emitting element and emit light to the outside. The light transmissive layer 333 may be formed of a transparent material used in the overcoat layer 320, the passivation layer 303, and the buffer layer 302.

For example, the light conversion layer is a transparent organic layer and may include the same transparent organic material as the material forming the overcoat layer. When the light emitting element outputs blue light, the first light conversion layer 331 may include first quantum dots for converting blue light into red light in the transparent organic material, the second light conversion layer 332 may include second quantum dots for converting blue light into green light in the transparent organic material, and the light transmissive layer 333 may include only a transparent organic material or a scattering material without including quantum dots.

When the light output from the light emitting element is white light, the first light conversion layer 331 may convert the light output from the light emitting element into first light, and the first light may be red light. The second light conversion layer 332 may convert light output from the light emitting element into second light, and the second light may be green light. The third light conversion layer (not shown) may convert light output from the light emitting element into third light, and the third light may be blue light.

For example, when the light emitting element outputs white light, the first light conversion layer 331 may include first quantum dots for converting white light into red light in the transparent organic material, the second light conversion layer 332 may include second quantum dots for converting white light into green light in the transparent organic material, and the third light conversion layer (not shown) may include third quantum dots for converting white light into blue light in the transparent organic material.

A second quantum dot barrier layer 334 may be disposed on the light conversion layer 331 and 332. A second quantum dot barrier layer 334 may be disposed on the light transmissive layer 333.

It is beneficial to prevent damage to the light conversion layer 331 and 332 including quantum dots during the manufacturing process or during use after manufacturing. For example, it is beneficial to prevent the outgassing generated from the outside from damaging quantum dots included in the light conversion layer 331 and 332, thereby preventing the quantum dots from failing to convert the light output from the light emitting element into the first light, the second light, or the third light.

To that end, the second quantum dot barrier layer 334 may be interposed between the light conversion layer 331 and 332 or the light transmissive layer 333 and the auxiliary layer 335.

The second quantum dot barrier layer 334 may be formed of an inorganic material such as silicon nitride ($SiN_x$), silicon oxide ($SiO_x$), silicon oxynitride ($SiO_xN_y$), or the like to prevent the outgassing from passing therethrough. The second quantum dot barrier layer 334 may be formed of a single layer or multiple layers thereof.

An auxiliary layer 335 may be disposed on the second quantum dot barrier layer 334.

The auxiliary layer 335 may serve to increase light emission efficiency by increasing light conversion efficiency as the light output from the light emitting element 325 is re-absorbed in the light conversion layer 331 and 332.

The auxiliary layer 335 may include a reflective material having excellent reflection efficiency.

For example, the reflective material included in the auxiliary layer 335 may include any one of aluminum (Al), silver (Ag), copper (Cu), magnesium (Mg), platinum (Pt), gold (Au), nickel (Ni), neodymium (Nd), iridium (Ir), chromium (Cr), an alloy thereof, and an APC (Ag/Pd/Cu) alloy.

The auxiliary layer 335 may be formed in a multilayer structure of any one of a stacked structure (Ti/Al/Ti) of aluminum (Al) and titanium (Ti), a stacked structure (ITO/Al/ITO) of aluminum (Al) and ITO, an alloy of APC (Ag/Pd/Cu), and a stacked structure (ITO/APC/ITO) of APC alloy and ITO, or may be formed in a single layer structure or a multilayer structure of at least one of aluminum (Al), silver (Ag), copper (Cu), magnesium (Mg), platinum (Pt), gold (Au), nickel (Ni), neodymium (Nd), iridium (Ir), chromium (Cr), and alloys thereof.

As the auxiliary layer 335 includes a reflective material and the second electrode 323 includes a transparent conductive material, the light output from the light emitting element 325 is repeatedly reflected between the second electrode 323 and the auxiliary layer 335, thereby increasing the light conversion efficiency at the quantum dots included in the light conversion layer 331 and 332 and hence enhancing the efficiency of light emitted to the outside in the direction of the first electrode 321.

FIG. 5 is a cross-sectional view illustrating a structural feature of a display device to which a structure according to embodiments of the disclosure is applied.

Referring to FIG. 5, the light output from the light emitting element 325 may be converted into light of a desired color in the light conversion layer 331 and 332. However, part of the light output from the light emitting element 325 may be not or little converted into light of the desired color.

Referring to FIG. 5, part L1 of the light output from the light emitting element 325 of the green (G) subpixel SP2 may be extracted to the outside through the green (G) color filter layer 311.

Part L2 of the light output from the light emitting element 325 may be not or little converted into green light at the second light conversion layer 332. In this case, the partial light L2 may be reflected by the auxiliary layer 335 and may be converted into green light by the second light conversion layer 332 while being directed to the second electrode 323 and may pass through the first electrode 321. In addition, the partial light L2 may be re-reflected by the second electrode 323 and directed to the auxiliary layer 335, and may be converted into green light by the second light conversion layer 332 and reflected by the auxiliary layer 335 and pass through the first electrode.

In other words, as the light output from the light emitting element 325 is repeatedly reflected between the auxiliary layer 335 and the second electrode 323, the light may be converted into the color of the corresponding subpixel by the light conversion layer 331 and 332.

The light L2 passing through the first electrode may be extracted to the outside through the green (G) color filter layer 311.

Thus, according to embodiments of the disclosure, as the auxiliary layer 335 includes a reflective material and the second electrode 323 includes a transparent conductive material, the light output from the light emitting element 325 is repeatedly reflected between the auxiliary layer 335 including the reflective material and the second electrode 323 including the transparent conductive material, thereby increasing the light conversion efficiency at the quantum dots included in the light conversion layer 331 and 332 and hence enhancing the efficiency of emitted light.

Not only when the second electrode 323 has a single-layer structure including a transparent conductive material as described above but also when the second electrode 323 has a single-layer structure of a semi-transmissive material or a multi-layer structure of a transparent conductive material and a semi-transmissive conductive material, the efficiency of emitted light may be enhanced by the repeated reflection of light between the auxiliary layer and the second electrode.

An upper protection layer 336 may be disposed on the second quantum dot barrier layer 334. The upper protection layer 336 may include an organic material layer. In embodiments of the disclosure, the upper protection layer 336 may be omitted.

According to embodiments of the disclosure, there may be provided a display device capable of mitigating leakage of the light reflected at the auxiliary layer by reducing the cell gap between the light emitting element and the auxiliary layer by applying a structure in which a black matrix is inserted into a trench provided in the bank layer.

According to embodiments of the present disclosure, there may be provided a display capable of enhancing light extraction efficiency by increasing light conversion efficiency in quantum dots included in the light conversion layer by applying a structure in which the auxiliary layer includes a reflective material, and the second electrode includes a transparent conductive material.

According to embodiments of the present disclosure, there may be provided a display device requiring a reduction in pixel size and an increase in the number of pixels through enhancement of the viewing angle by reducing the external propagation distance of the light reflected at the auxiliary layer by applying a structure in which a black matrix is inserted into a trench provided in the bank layer.

According to embodiments of the present disclosure, there may be provided a display device capable of preventing migration of quantum dots to the adjacent pixels when manufacturing the light conversion layer by applying a structure in which a black matrix is inserted into a trench provided in the bank layer.

Embodiments of the disclosure described above are briefly described below.

A display device according to embodiments of the disclosure may comprise a substrate including at least one of red, green, and blue subpixels, a color filter layer disposed on the substrate and having a color corresponding to each of the at least one subpixel, a light emitting element including a first electrode disposed on the color filter layer, a light emitting layer disposed on the first electrode, and a second electrode disposed on the light emitting layer, a bank layer having an opening exposing at least a portion of the first electrode, a black matrix disposed in a trench provided in the bank layer and protruding beyond an upper surface of the bank layer, a light conversion layer disposed on the light emitting element and including quantum dots, and an auxiliary layer disposed on the light conversion layer.

The first electrode and the second electrode may include a transparent conductive material. The auxiliary layer may include a reflective material.

The auxiliary layer may include any one selected from the group consisting of aluminum (Al), silver (Ag), copper (Cu), magnesium (Mg), platinum (Pt), gold (Au), nickel (Ni), neodymium (Nd), iridium (Ir), and chromium (Cr), or any one of alloys including at least one thereof.

The first electrode and the second electrode may include any one of indium-tin-oxide (ITO), indium-zinc-oxide (IZO), indium-gallium-zinc-oxide (IGZO), indium-tin-zinc-oxide (ITZO), zinc-tin-oxide (ZTO), fluorine-tin-oxide (FTO), aluminum-zinc-oxide (AZO), antimony-tin-oxide (ATO), titanium oxide ($TiO_2$), indium oxide ($In_2O_3$), tin oxide ($SnO_2$), zinc oxide (ZnO), and a silver-magnesium (Ag—Mg) alloy.

A width W1 of a lower surface of the opening OP may be smaller than a width W2 of an upper surface of the opening OP. For example, the opening OP as shown in FIG. 4 has a reverse trapezoidal cross-section and therefore the width of the opening OP at the top is wider than the width of opening OP at the bottom.

In some embodiments, the quantum dots may fill on a lower surface of the opening, higher than on the upper surface of the bank layer.

In some embodiments, the quantum dots may fill lower than an upper surface of the black matrix.

A second quantum dot barrier layer 334 may be provided on a lower surface of the auxiliary layer 335 to be spaced apart from the upper surface of the bank layer 340. The quantum dots may fill up to an area where the bank layer 340 and the second quantum dot barrier layer 334 are spaced apart from each other.

The light emitting element may output blue light. The light conversion layer may include a first light conversion layer converting the blue light into red light, a second light conversion layer converting the blue light into green light, and a light transmissive layer transmitting the blue light.

The light emitting element may output white light. The light conversion layer may include a first light conversion layer converting the white light into red light, a second light conversion layer converting the white light into green light, and a third light conversion layer converting the white light into blue light.

A display device according to embodiments of the disclosure may comprise a substrate, a color filter layer disposed on the substrate, a light emitting element disposed on the color filter layer, a bank layer disposed on the substrate and defining an opening overlapping the light emitting element and having an upper surface and a lower surface smaller in width than the upper surface, a first quantum dot barrier layer disposed on the light emitting element and the bank layer, a second quantum dot barrier layer disposed to be spaced apart from the first quantum dot barrier layer, an auxiliary layer disposed on the second quantum dot barrier layer, and a light conversion layer disposed between the first quantum dot barrier layer and the second quantum dot barrier layer. The light conversion layer may be filled with quantum dots from the lower surface of the opening to the upper surface of the opening.

The bank layer may have a trench in an upper surface thereof. A black matrix may be seated in the trench and protrudes beyond the upper surface of the bank layer. The quantum dot may fill higher than the upper surface of the bank layer. The quantum dot may fill lower than an upper surface of the black matrix.

The first electrode and the second electrode may include a transparent conductive material. The auxiliary layer may include a reflective material.

The auxiliary layer may include any one selected from the group consisting of aluminum (Al), silver (Ag), copper (Cu), magnesium (Mg), platinum (Pt), gold (Au), nickel (Ni), neodymium (Nd), iridium (Ir), and chromium (Cr), or any one of alloys including at least one thereof.

The first electrode and the second electrode may include any one of indium-tin-oxide (ITO), indium-zinc-oxide (IZO), indium-gallium-zinc-oxide (IGZO), indium-tin-zinc-oxide (ITZO), zinc-tin-oxide (ZTO), fluorine-tin-oxide (FTO), aluminum-zinc-oxide (AZO), antimony-tin-oxide (ATO), titanium oxide ($TiO_2$), indium oxide ($In_2O_3$), tin oxide ($SnO_2$), zinc oxide (ZnO), and a silver-magnesium (Ag—Mg) alloy.

An encapsulation layer in which a plurality of organic films and inorganic films are stacked may be disposed on the second electrode. The first quantum dot barrier layer may be disposed on the encapsulation layer.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate;
   at least one of red, green, and blue subpixels on the substrate;
   a color filter layer disposed on the substrate and having a color corresponding to each of the at least one subpixel;
   a light emitting element including a first electrode disposed on the color filter layer, a light emitting layer disposed on the first electrode, and a second electrode disposed on the light emitting layer;
   a bank layer having at least a portion of the first electrode extending into the bank layer;
   a trench provided in the bank layer;
   a black matrix disposed in the trench, the black matrix protruding beyond an upper surface of the bank layer;
   a light conversion layer disposed on the light emitting element and including quantum dots; and
   an auxiliary layer disposed on the light conversion layer.

2. The display device of claim 1, wherein the first electrode and the second electrode include a transparent conductive material, and
   wherein the auxiliary layer includes a reflective material.

3. The display device of claim 1, wherein the auxiliary layer includes any one selected from the group consisting of aluminum (Al), silver (Ag), copper (Cu), magnesium (Mg), platinum (Pt), gold (Au), nickel (Ni), neodymium (Nd), iridium (Ir), and chromium (Cr), or any one of alloys including at least one thereof, and
   wherein the first electrode and the second electrode include any one of indium-tin-oxide (ITO), indium-zinc-oxide (IZO), indium-gallium-zinc-oxide (IGZO), indium-tin-zinc-oxide (ITZO), zinc-tin-oxide (ZTO), fluorine-tin-oxide (FTO), aluminum-zinc-oxide (AZO), antimony-tin-oxide (ATO), titanium oxide ($TiO_2$), indium oxide ($In_2O_3$), tin oxide ($SnO_2$), zinc oxide (ZnO), and a silver-magnesium (Ag—Mg) alloy.

4. The display device of claim 1, wherein a width of a lower surface of an opening positioned between adjacent bank layers is smaller than a width of an upper surface of the opening.

5. The display device of claim 1, wherein the quantum dots fill on a lower surface of an opening positioned between adjacent bank layers, higher than on the upper surface of the bank layer.

6. The display device of claim 5, wherein the quantum dots fill lower than an upper surface of the black matrix.

7. The display device of claim 1, wherein a second quantum dot barrier layer is provided on a lower surface of the auxiliary layer to be spaced apart from the upper surface of the bank layer, and wherein the quantum dots fill up to an area where the bank layer and the second quantum dot barrier layer are spaced apart from each other.

8. The display device of claim 1, wherein the light emitting element outputs blue light, and wherein the light conversion layer includes:

a first light conversion layer converting the blue light into red light;

a second light conversion layer converting the blue light into green light; and a light transmissive layer transmitting the blue light.

9. The display device of claim 1, wherein the light emitting element outputs white light, and wherein the light conversion layer includes:

a first light conversion layer converting the white light into red light;

a second light conversion layer converting the white light into green light; and a third light conversion layer converting the white light into blue light.

10. A display device, comprising:

a substrate;

a color filter layer disposed on the substrate;

a light emitting element disposed on the color filter layer;

a bank layer disposed on the substrate and defining an opening overlapping the light emitting element and having an upper surface and a lower surface smaller in width than the upper surface;

a first quantum dot barrier layer disposed on the light emitting element and the bank layer;

a second quantum dot barrier layer disposed to be spaced apart from the first quantum dot barrier layer;

an auxiliary layer disposed on the second quantum dot barrier layer; and a light conversion layer disposed between the first quantum dot barrier layer and the second quantum dot barrier layer, wherein the light conversion layer is filled with quantum dots from the lower surface of the opening to the upper surface of the opening.

11. The display device of claim 10, wherein the bank layer has a trench in an upper surface thereof, wherein a black matrix is seated in the trench and protrudes beyond the upper surface of the bank layer, wherein the quantum dots fill higher than the upper surface of the bank layer, and wherein the quantum dots fill lower than an upper surface of the black matrix.

12. The display device of claim 10, wherein the first electrode and the second electrode include a transparent conductive material, and wherein the auxiliary layer includes a reflective material.

13. The display device of claim 12, wherein the auxiliary layer includes any one selected from the group consisting of aluminum (Al), silver (Ag), copper (Cu), magnesium (Mg), platinum (Pt), gold (Au), nickel (Ni), neodymium (Nd), iridium (Ir), and chromium (Cr), or any one of alloys including at least one thereof, and wherein the first electrode and the second electrode include any one of indium-tin-oxide (ITO), indium-zinc-oxide (IZO), indium-gallium-zinc-oxide (IGZO), indium-tin-zinc-oxide (ITZO), zinc-tin-oxide (ZTO), fluorine-tin-oxide (FTO), aluminum-zinc-oxide (AZO), antimony-tin-oxide (ATO), titanium oxide (TiO$_2$), indium oxide (In$_2$O$_3$), tin oxide (SnO$_2$), zinc oxide (ZnO), and a silver-magnesium (Ag—Mg) alloy.

14. The display device of claim 12, wherein an encapsulation layer in which a plurality of organic films and inorganic films are stacked is disposed on the second electrode, and wherein the first quantum dot barrier layer is disposed on the encapsulation layer.

* * * * *